United States Patent
Crawford et al.

(10) Patent No.: US 7,014,959 B2
(45) Date of Patent: *Mar. 21, 2006

(54) CD UNIFORMITY OF CHROME ETCH TO PHOTOMASK PROCESS

(75) Inventors: Shaun B. Crawford, Jericho, VT (US); Timothy J. Dalton, Ridgefield, CT (US); Thomas B. Faure, Milton, VT (US); Cuc K. Huynh, Jericho, VT (US); Michelle L. Steen, Danbury, CT (US); Thomas M. Wagner, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 50 days.

This patent is subject to a terminal disclaimer.

(21) Appl. No.: 10/605,801

(22) Filed: Oct. 28, 2003

(65) Prior Publication Data

US 2004/0262264 A1 Dec. 30, 2004

Related U.S. Application Data

(63) Continuation-in-part of application No. 10/604,181, filed on Jun. 30, 2003.

(51) Int. Cl.
*G03F 9/00* (2006.01)
*G03C 5/00* (2006.01)

(52) U.S. Cl. .................... 430/5; 430/313; 430/314; 430/318; 430/323

(58) Field of Classification Search .................. 430/5, 430/313, 314, 318, 323; 216/67
See application file for complete search history.

(56) References Cited

U.S. PATENT DOCUMENTS

| | | | |
|---|---|---|---|
| 4,690,729 A | 9/1987 | Douglas | |
| 4,916,511 A | 4/1990 | Douglas | |
| 5,010,378 A | 4/1991 | Douglas | |
| 5,185,058 A | 2/1993 | Cathey, Jr. | |
| 5,837,615 A | 11/1998 | Rostoker | 438/711 |
| 6,544,894 B1 | 4/2003 | Kobayashi | 438/706 |
| 2005/0008945 A1 * | 1/2005 | Brooks et al. | 430/5 |

* cited by examiner

*Primary Examiner*—Christohper G. Young
(74) *Attorney, Agent, or Firm*—Richard Kotulak, Esq.; Greenblum & Bernstein, P.L.C.

(57) ABSTRACT

A photomask is formed by depositing an opaque layer on a transparent substrate. A resist is formed on the opaque layer and selectively patterned to expose the portions of the opaque layer that are to be etched out. During the dry etching step, the photomask is exposed to an etchant gas mixture which exhibits a selectivity equal to or higher than 1.2:1 between the opaque layer and the resist layer. Due to the selectivity of the gas mixture, a thinner resist film can be used, thereby increasing resolution and accuracy of the opaque layer pattern. Also, due to reduced susceptibility to both a macro-loading effect and a pattern density effect, overetching of the resist and underetching of the opaque layer are significantly reduced, thereby achieving improved etching uniformity and consequently improved CD uniformity.

27 Claims, 9 Drawing Sheets

POR No Bars

FIG. 7A

POR with Bars

FIG. 7B

Bars with Hi O2

FIG. 7C

Bars with Co2/O2

FIG. 7D

CD UNIFORMITY OF CHROME ETCH TO PHOTOMASK PROCESS

CROSS REFERENCE TO RELATED APPLICATIONS

This Application is a continuation-in-part application of co-pending U.S. application Ser. No. 10/604,181, filed on Jun. 30, 2003, and which is now incorporated herein by reference in its entirety.

BACKGROUND OF INVENTION

1. Field of the Invention

The invention generally relates to a mask for photolithographic manufacturing and, more particularly to method for etching the mask by using a gas mixture having a selectivity between an opaque layer and a resist layer.

2. Background Description

Patterning a thin film layer to a desired pattern is important in various industries, for example, semiconductor integrated circuit fabrication. To achieve this goal, the target layer is overlapped with a mask having a corresponding pattern and exposed to an illumination source, for example, light, x-ray, e-beam, etc. In photolithography for semiconductor fabrication, it has been a common practice to use a chromium (Cr) mask as a light shield which is a chromium film in a specific pattern formed on a quartz substrate. The opaque layer of the mask may also be, for example, chromium containing compounds, molybdenum alloy and tungsten.

By way of example, the mask may be formed by patterning an opaque layer on a transmitting substrate according to a desired pattern. The opaque layers are commonly chromium, chromium-containing compounds, molybdenum alloy, and tungsten. A conventional mask comprises a structure in which a chromium layer, which is an opaque layer, is formed on a light-transmitting substrate, such as a quartz substrate. Furthermore, a chromium oxide layer for preventing reflection by the chromium layer, may be formed on the chromium layer. An organic resist is then formed on the chromium or chromium oxide layer, and the resist is patterned, as by optical or electron beam scanning followed by wet developing.

In recent pursuit of micro-fabrication, there has been increasing demand for proximity correction masks, in which the dimensions of fabrication are smaller than the wavelength of exposing light. In other words, in photolithography for patterning with dimensions smaller than the wavelength of exposing light, it is necessary to accurately control the intensity of light or the amount of light passing through the opening and the diffraction of light. This control is accomplished by a proximity effect correcting mask with accurate fine patterns which do not form images on the wafer. Thus, higher resolution and finer patterning are necessary.

A dry etching method is typically used to remove the exposed chromium oxide/chromium layer by means of a plasma process using a gaseous mixture of chlorine and oxygen as the etchant species. The dry etching is commonly used since it significantly improves patterned shapes (e.g., edge roughness and profile) and resolution of fine patterns as compared to wet etching.

Presently, a gas mixture of oxygen and chlorine is widely used as an etchant for dry etching chromium masks. In certain applications, helium is added to the mixture for plasma stabilization and uniformity. However, the gas mixture of chlorine and oxygen exhibits a low selectivity (e.g., 1:1) between the chromium thin film and a resist. The selectivity is further sacrificed when helium (He) is added for plasma stabilization and uniformity. Also, the oxygen element in the gas mixture tends to etch the resist at an undesirably high rate. Thus, the resist must be formed thick enough to avoid any overetching problems. For example, in order to pattern a chromium layer having a thickness of about 1000 Å, a resist should be formed at the thickness of at least 3000 Å to 5000 Å be safe from the overetching problems. This undesirably thick resist degrades the resolution and accuracy of the chromium pattern during the dry etching. Furthermore, the selectivity between the chrome and the resist layer is highly sensitive to the amount of chrome exposed to the etchant species as a sharp decline in the selectivity is observed with increasing chrome load.

Also, it has been observed that the selectivity between chromium and a resist is highly sensitive to the amount of chromium exposed to the etchant gas mixture of chlorine and oxygen during the etching process. For example, the selectivity of the gas mixture of chlorine and oxygen sharply declines as a larger area of the chromium layer is exposed to the etchant, which is commonly known as a macro-loading effect. Thus, in order to accurately pattern a larger area of chromium, a significantly larger amount of the etchant is required. However, the resist is less susceptible to the macro-loading effect than chromium and therefore an unnecessarily large amount of the resist can be stripped off due to the excessive amount of the etchant gas mixture, thereby causing overetching problems.

In addition, gaseous mixtures of nitrogen, chlorine and oxygen, or alternately, helium, chlorine and oxygen have been used to reduce the macro-loading effect associated with the dry etching of the chrome. However, the chrome to resist selectivity with these chemistries is less than that for chlorine and oxygen.

Further, it has been known that chromium exposed adjoining a highly populated resist pattern is etched less than chromium exposed far from the highly populated resist pattern, which is known as a pattern density effect. It has been observed that the gas mixture of chlorine and oxygen is susceptible to the pattern density effect, thereby deterring etching uniformity. For example, during the resist patterning step, a wide resist frame is sometimes formed along the edges of the substrate, and chromium exposed adjoining the wide resist frame is significantly underetched due to the pattern density effect. Therefore, there is a need for effective methodology for patterning a photomask with higher resolution and accuracy with etching uniformity.

SUMMARY OF INVENTION

In an aspect of the invention, a method of manufacturing a photomask is provided. The method includes the steps of forming a resist layer on a portion of the opaque layer, and the opaque layer is etched by using a gas mixture having a selectivity equal to or higher than 1.2:1 between the opaque layer and the resist layer.

Another aspect of the invention, a method is provided which includes etching an opaque layer by using a gas mixture of $Cl_2$, He, $O_2$ and $CO_2$ having a gas mixture of 4:1:1:2.5 and a gas mixture ratio in volume of about 60% for $Cl_2$, 9% for He, 6% for $O_2$ and 25% for $CO_2$. The opaque layer is Cr, a Cr compound, a Mo alloy or W.

In yet another aspect, a method for manufacturing the photomask includes etching an opaque layer by using a gas mixture of $Cl_2$, He, $O_2$ and $CO_2$ with etch conditions between about a ratio of 40 for $O_2$ and 10 for $CO_2$ and 10 for $O_2$ and 40 for $CO_2$. The etch conditions provide a zero iteration mask fabrication. In embodiments of this aspect, the etch conditions provide a selectivity of Cr:Resist of about 1.2:1 and provide CD uniformity in 3 sigma of less than 10 nm and in range of about 20 nm or less.

In another aspect, a photomask comprising a substrate and an opaque layer is selectively formed on the substrate. The mask is manufactured by etching the opaque layer by using a gas mixture having a selectivity of approximately equal to or higher than 1.2:1 between the opaque layer and the resist layer. In embodiments, the gas mixture is $Cl_2$, He, $O_2$ and $CO_2$ with a ratio of gas mixture among $Cl_2$, He, $O_2$ and $CO_2$ being 4:1:1:2.5 and the gas mixture ratio in volume being about 60% for $Cl_2$, 8.7% for He, 6.2% for $O_2$ and 25% for $CO_2$.

DETAILED DESCRIPTION

The invention enables manufacturing a photomask exhibiting a high resolution and low defects by using an etchant that has a selectivity of about or higher than at least 1.2:1 between an opaque layer and a resist layer. In an embodiment, the etchant is a gas mixture of Cl, He, O and C (e.g., a gas mixture of $Cl_2$, He and CO or $CO_2$, preferably in the ratio of 4:1:1), a gas mixture of Cl, He, O and N (e.g., a gas mixture of $Cl_2$, He and NO or $NO_2$, preferably in the ratio of 4:1:1), a gas mixture of Cl, He, O and S (e.g., a gas mixture of $Cl_2$, He and $SO_2$, preferably in the ratio of 4:1:1) or a gas mixture of Cl, He and $O_3$ (e.g., a gas mixture of $Cl_2$, He and $O_3$, preferably in the ratio of 4:1:1). In another embodiment, a small diluent flow of $O_2$ may be used in the chemistry of, for example, $Cl_2$ and $CO_2$. The $Cl_2$ and $CO_2$ mixture ratio may be approximately 2:1 ratio with the $Cl_2$, $CO_2$ and $O_2$ mixture at a ratio of approximately 2:1:0.25. In addition, a gas mixture of $Cl_2$, He, $O_2$ and $CO_2$ in a ratio of about 4:1:1:2.5 may be used in accordance with the invention. The use of these etchants enables a higher selectivity than that of the conventional gas mixtures, in embodiments, and also potentially enables a reduction in the thickness of the resist layer as well as a reduction in the etch bias. That is, due to the high selectivity, in some embodiments, it is not necessary to form an undesirably thick resist layer to avoid overetching. In the embodiments of the invention, it is also possible to obtain an improvement in the critical dimension (CD) uniformity by obtaining a reduction in the 3-sigma and in range, as discussed below.

By using the etchants of the invention, the resist can be formed at a significantly reduced thickness, and the opaque layer can be patterned with higher resolution and increased accuracy. Also, the aforementioned gas mixtures are less susceptible to the macro-loading effect and the resist is not exposed to an excessive amount of the gas mixture, thereby significantly reducing overetching problems. Further, the etchants of the invention are less susceptible to the pattern density effect and hence significantly improve the underetching problem near a highly populated resist area, thereby achieving etching uniformity.

Figure 1A:
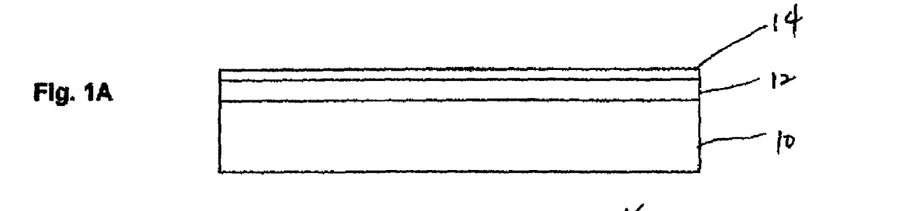
FIGS. 1A to 1E depict sequential phases of a method according to an embodiment of the invention.

FIG. 1A shows a photomask structure prior to depositing a resist and performing patterning according to an embodiment of the invention. The resist layer may be, for example, a CAR (chemically amplified resist) or e-beam resist or laser (optical) type resist. The photomask includes a substrate 10, typically formed of a transparent material, for example, glass or SiON. On the transparent substrate 10, an opaque layer 12 is formed by depositing an opaque material, for example, Cr, a Cr compound, a Mo alloy or W.

FIG. 1A further shows an optional reflection prevention layer 14 formed on the opaque layer 12 to prevent light from an illumination source to be reflected from the opaque layer. The reflection prevention layer 14 is optional and not necessary to implement the invention. The reflection prevention layer 14 can be formed by natural oxidation of the opaque layer 12. For example, in the case the opaque layer 12 is formed of Cr, a Cr oxide that is naturally formed from its underlying Cr layer can be used as the reflection prevention layer 14. Another advantage of forming an oxide layer is that, during a subsequent step, it is easier to pattern a Cr layer with a Cr oxide formed thereon than to pattern only the Cr layer due to the chemical reactive characteristics. According to an embodiment of the invention, the reflection prevention layer 14 is formed at a thickness of about 300 Å on the opaque layer 12 having a thickness of about 700 Å.

Figure 1B:
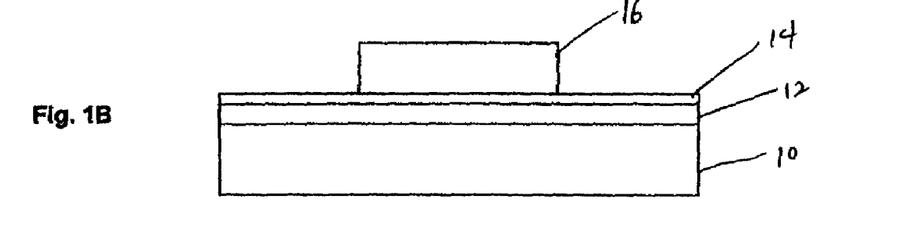

FIG. 1B shows a resist layer 16 formed on a portion of the opaque layer 12. The resist layer 16 is formed of a light-sensitive material, for example, plastic or organic polymer, that is hardened or softened when exposed to a specific light. After being exposed to a specific light to form a pattern, the softened portion of the light sensitive material is washed away, thereby leaving only the hardened portion that constitutes a resist pattern.

FIG. 1B equally represents the resist after removing the softened portion to form a resist pattern that selectively overlaps a portion of the opaque layer 12 to expose potions of the opaque layer 12 that are to be etched. As previously mentioned, it is not necessary to form a thick resist layer. Thus, in the case the opaque layer is formed at a thickness of about 1000 Å with or without the optional reflection prevention layer 14, the resist layer 16 is formed at a thickness of approximately between about 2500 Å and 5000 Å.

Figure 1C:
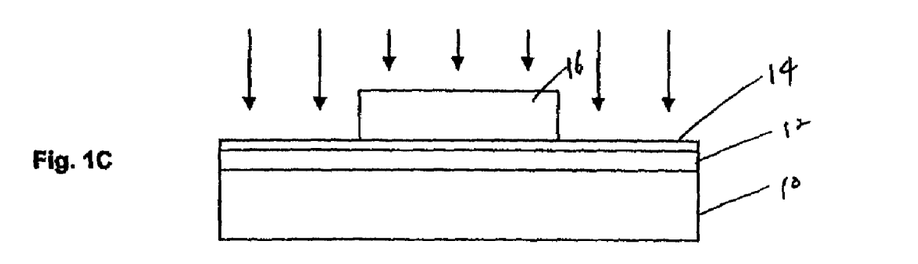

After forming the resist pattern 16, the mask structure is subject to a dry etching, as shown in FIG. 1C. During the dry etching, the mask structure is exposed to a gas mixture having a selectivity approximately equal to or higher than 1.2:1 between the opaque layer 12 and the resist layer 16. The gas mixture removes the portions of the opaque layer 12 that are not overlapped by the resist 16. According to the invention, the etchant is selected from a gas mixture of Cl, He, O and C (e.g., a gas mixture of $Cl_2$, He and CO or $CO_2$, preferably in the ratio of 4:1:1), a gas mixture of Cl, He, O and N (e.g., gas mixture of $Cl_2$, He and NO or $NO_2$, preferably in the ratio of 4:1:1), a gas mixture of Cl, He, O and S (e.g., $Cl_2$, He and $SO_2$, preferably in the ratio of 4:1:1)

or a gas mixture of Cl, He and $O_3$ (e.g., $Cl_2$, He and $O_3$, preferably in the ratio of 4:1:1). Also, a gas mixture of Cl, O and C (e.g., $Cl_2$ and $CO_2$ with a small flow of $O_2$, in the ratio of approximately 2:1:0.25) can be used. In addition, a gas mixture of $Cl_2$, He, $O_2$ and $CO_2$ in a ratio of about 4:1:1:2.5 may be used in accordance with the invention. In one implementation, the gas mixture ratio in volume is about 60% for $Cl_2$, 8.7% (9%) for He, 6.2% (6%) for $O_2$ and 25% for $O_2$. These gas mixtures exhibit a selectivity substantially equal to or higher than 1.2:1 between the opaque layer 12 and the resist 16, as discussed in more detail below.

Figure 1D:
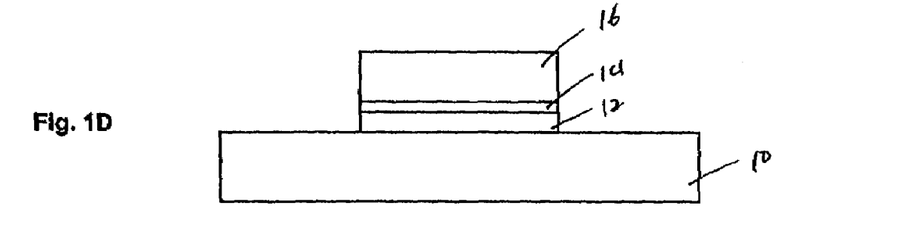

FIG. 1D shows the photomask structure after performing dry etching with the etchant gas mixture having a high selectivity. Due to the higher selectivity between the opaque layer 12 and the resist 16, the resist layer 16 can now be formed at a significantly reduced thickness without suffering from overetching problems. Since the thickness of the resist 16 is significantly reduced, the resist pattern can be formed at higher resolution with more accuracy which this translates to an more accurate opaque layer pattern 12 formed on the transparent substrate 10. Also, since the aforementioned gas mixtures is less susceptible to the macro-loading effect, the resist is not exposed to an excessive amount of the gas mixture, thereby significantly reducing overetching problems (as illustrated in FIG. 4). Further, the aforementioned gas mixture is less susceptible to the pattern density effects, thereby achieving etching uniformity throughout the entire chromium layer.

Figure 1E:
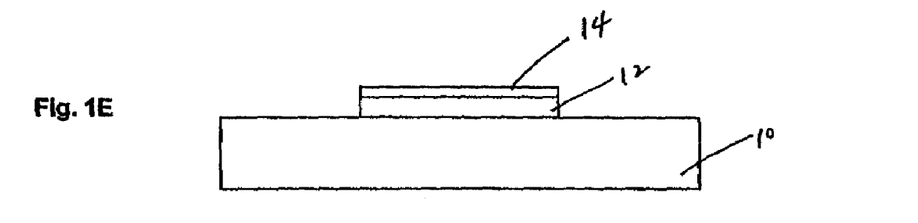
Figure 2:
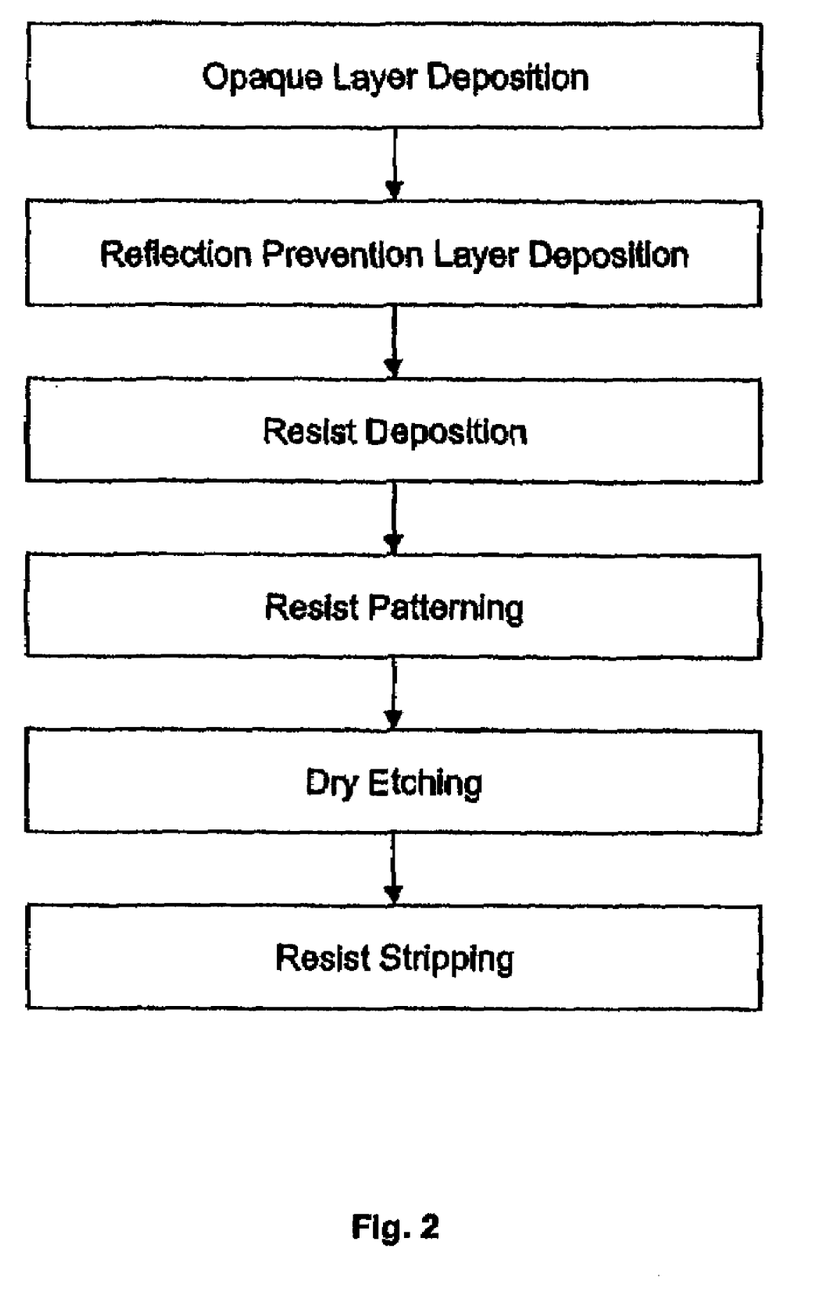
FIG. 2 depicts a flow-chart showing sequential phases of a method according to an embodiment of the invention.

Subsequently, as shown in FIG. 1E, the resist layer 16 is stripped off by conventional dry or wet stripping or ashing processes. The sequential phases of the processing steps described above are also illustrated as a flow chart in FIG. 2. The resulting photomask comprises the transparent substrate 10, the opaque layer 12 and an optional reflection prevention layer 14. As explained so far, the invention significantly improves the resolution and accuracy of the opaque layer pattern and significantly reduces overetching problems.

Figure 3:
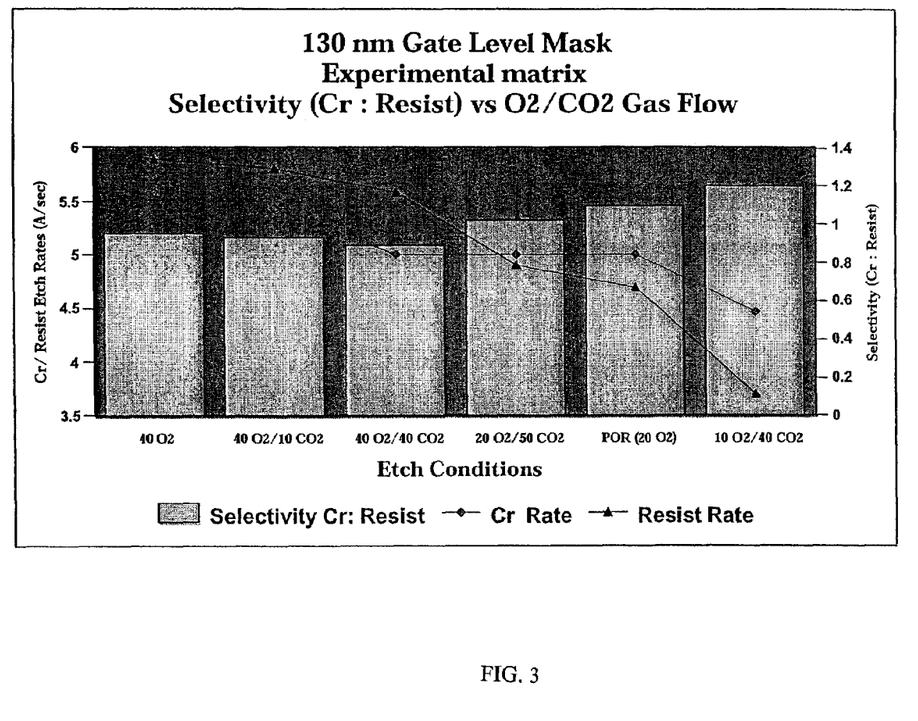
FIG. 3 shows a graph of selectivity versus Cr and Resist etch rates in accordance with the invention.

FIG. 3 shows a graph of selectivity versus Cr and Resist etch rates in accordance with the invention. FIG. 3 shows that at high $CO_2$ and $O_2$ gas ratio, the resist rate drops dramatically and results in the highest selectively for a large Cr area (greater than 8000 $mm^2$.

Table 1 shows the results of FIG. 3 in accordance with the invention. Referring to FIG. 3, the selectivity Cr: Resist ranges from 0.95 to 1.2 (or higher), depending on the gas mixture of $O_2$ and $CO_2$. For example, etch conditions of 40 standard cubic centimeters (SCCM) $O_2$ has a selectivity of Cr:Resist of 0.95. Also, the Cr rate ranges from 5.59 to 4.71 and the resist rate ranges from 5.89 to 3.71. Byway of example, the Cr rate and Resist rate of 10 SCCM $O_2$/40 SCCM $CO_2$ is 4.47 and 3.71, respectively, lead to the selectivity of Cr:Resist of about or equal to 1.2 or higher. In embodiments, when the selectivity is lower than 1:1, improvements in mask CD uniformity are still obtained.

TABLE 1

| Etch Conditions (SCCM) | Selectivity Cr: Resist | Cr Rate (Å/sec.) | Resist Rate (Å/sec.) |
| --- | --- | --- | --- |
| 40 $O_2$ | 0.95 | 5.59 | 5.89 |
| 40 $O_2$/10 $CO_2$ | 0.93 | 5.44 | 5.81 |
| 40 $O_2$/40 $CO_2$ | 0.89 | 5 | 5.58 |

TABLE 1-continued

| Etch Conditions (SCCM) | Selectivity Cr: Resist | Cr Rate (Å/sec.) | Resist Rate (Å/sec.) |
| --- | --- | --- | --- |
| 20 $O_2$/50 $CO_2$ | 1.02 | 5 | 4.9 |
| POR (20 $O_2$) | 1.1 | 5 | 4.69 |
| 10 $O_2$/40 $CO_2$ | 1.2 | 4.47 | 3.71 |

(POR: process of record)

Figure 4A:
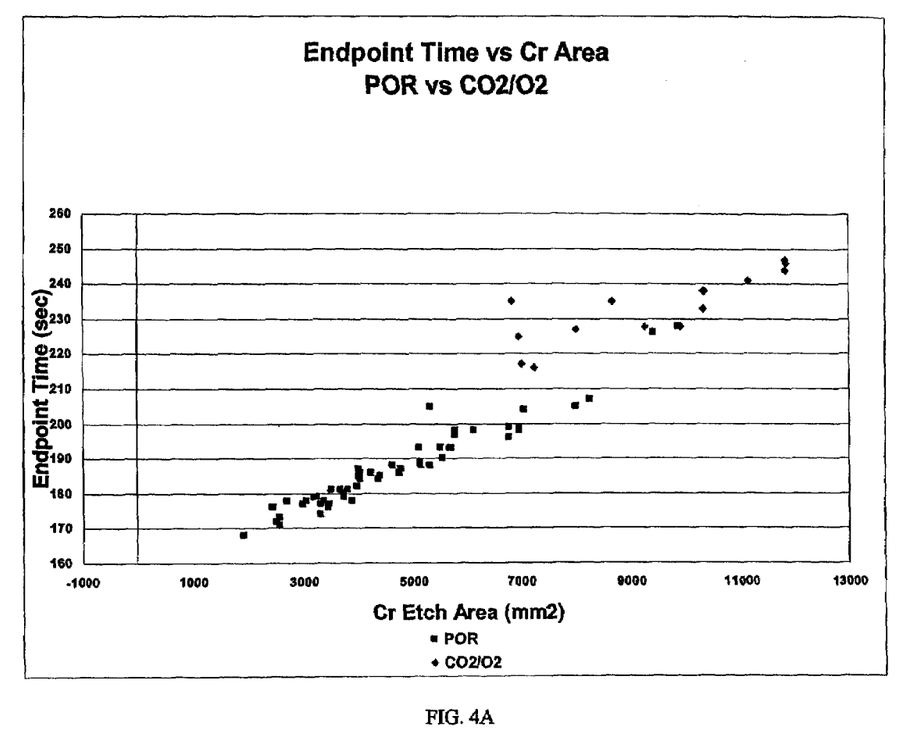
FIG. 4A shows a graph of endpoint time vs. Cr area loading comparing to POR (Process of Record)

FIG. 4A shows a graph of endpoint time vs. Cr area loading comparing to POR (Process of Record). In this graph, it is shown that the addition of $CO_2$/$O_2$ gases to the $Cl_2$ etch process is less sensitive to the Cr etch area loading, i.e., Macroloading effect. Therefore, it is a more stable process than typical $Cl_2$ and $O_2$ etch process.

Figure 4B:
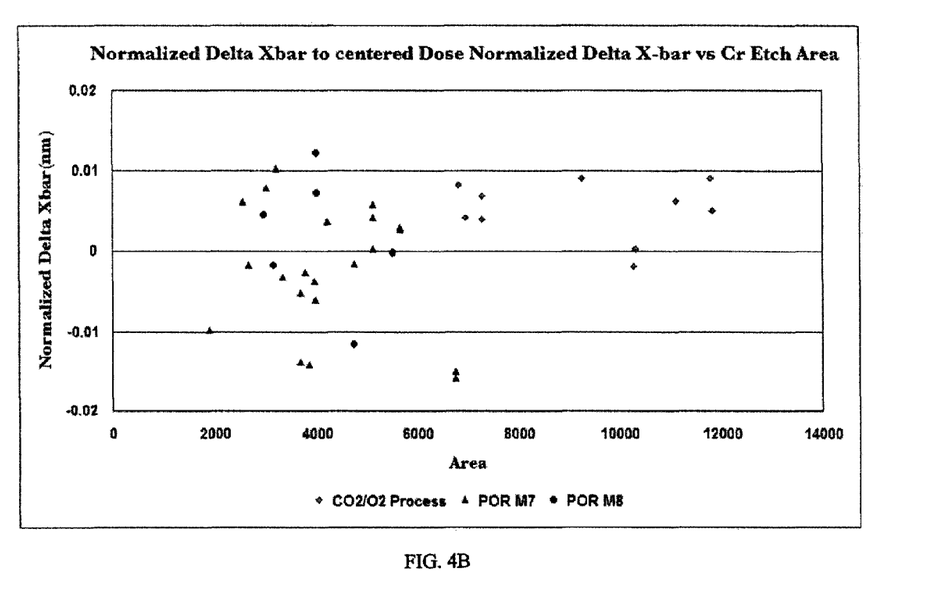
FIG. 4B shows the graph of normalized delta X-bar vs Cr etch area.

FIG. 4B shows the graph of normalized delta X-bar vs Cr etch area. This plot clearly indicates that $CO_2$/$O_2$ process has a variance of 10 nm over an area range of 5000 $mm^2$ in comparison with the typical $Cl_2$ and $O_2$ process which has a variance of 25 nm over a range of 5000 $mm^2$.

Figure 5A:
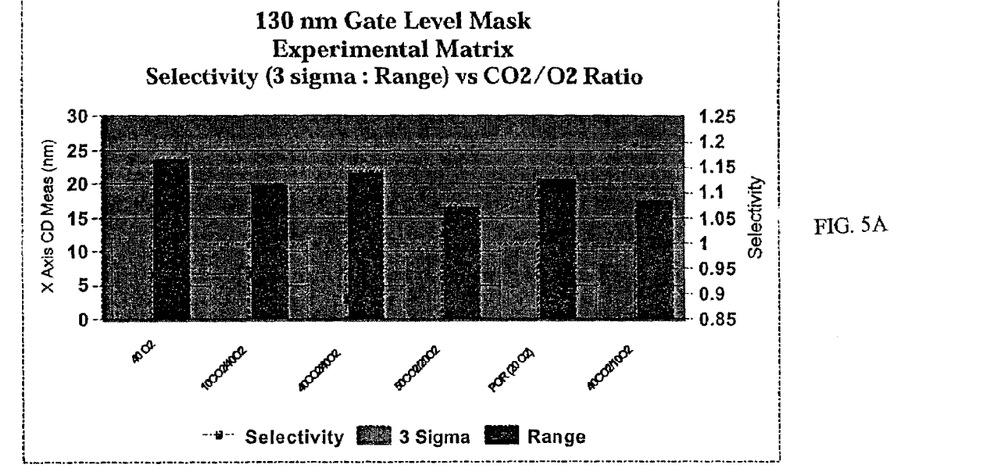
FIGS. 5A and 5B show graphs of selectivity versus CD uniformity in the X and Y directions, respectively, in accordance with the invention.
Figure 5B:
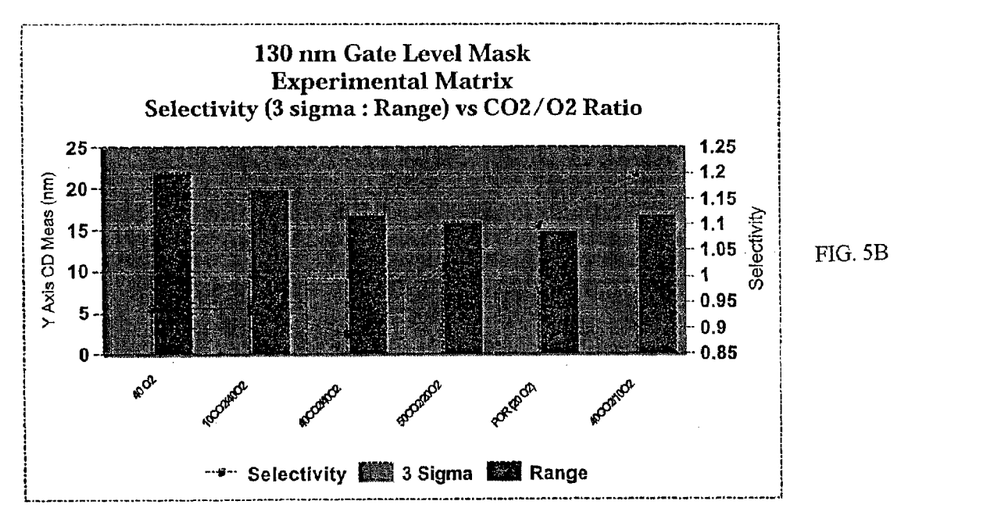

FIGS. 5A and 5B show graphs of selectively versus CD uniformity in the X and Y directions, respectively, in accordance with the invention. These graphs are representative of an experimental matrix of selectivity (3 sigma:Range) vs. $CO_2$/$O_2$. These graphs show a selectivity of 1.2:1 with etch conditions of 10 SCCM $O_2$/40 SCCM $CO_2$. This graph further shows the various CD measurements (nm) for the 3 Sigma and Range. As shown, the CD (critical dimension) uniformity, 3-sigma, for manufacturing a photomask has an improvement by 3–5 nm. 3-sigma is uniformity; it is the standard deviation times 3.

Figure 6A:
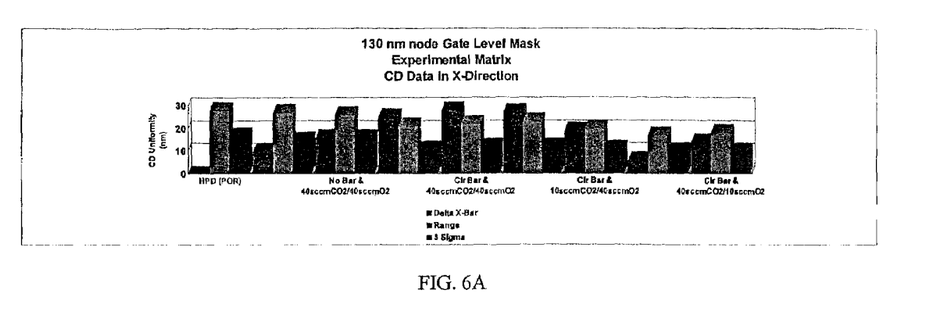
FIGS. 6A and 6B shows CD uniformity vs. etch conditions with Delta X-bar and Delta Y-bar, respectively.
Figure 6B:
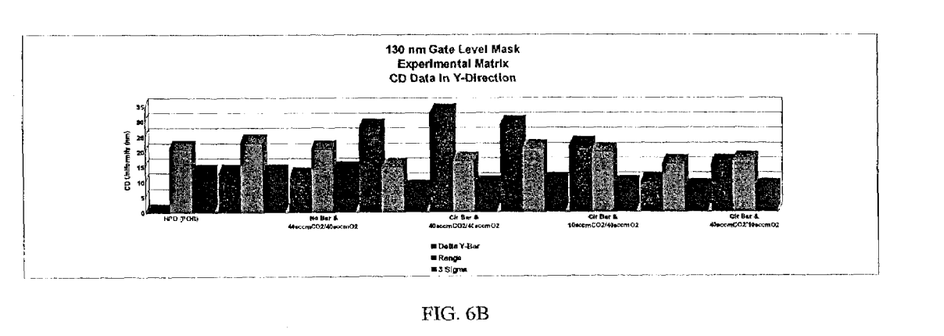

FIGS. 6A and 6B show CD uniformity vs. etch conditions with Delta X-bar and Delta Y-bar, respectively. As shown in FIGS. 6A and 6B, and reproduced in Table 2, below, several etch conditions are shown in relation to a Delta X-bar, range and 3-sigma and Delta Y-bar, range and 3-sigma, respectively. It has been found that the use of a clear bar or clear structure (added to the mask and surrounding the array or etched pattern) improves the CD uniformity. That is, it has been found that when clear bar is added to the mask, then etching with increased $O_2$ flow, the uniformity of the mask is improved. With the combination of $CO_2$/$O_2$, the uniformity as well as the selectivity is improved.

By way of example, the best 3-sigma is shown to be under 10 nm and the best range is shown to be under 20 nm. Also, by using the invention, it has been found that the process is very stable and clean; namely, the use of $CO_2$ does not provide any contaminants to the process and, of importance compared to known systems, there is a "zero" iteration in the production of masks. In other words, the process of the invention can build a mask on a first attempt, compared to two or more builds using known processes. In this manner, there is an increase in yield using the invention. This saves considerable cycle time, e.g., seven or more days of fabrication, material costs and labor.

TABLE 2

| | HPD (POR) | No Bar & Hi $O_2$ | No Bar & 40 (sccm) $CO_2$/40 (sccm) $O_2$ | Clear Bar (POR) | Clr Bar & 40 $CO_2$/40 $O_2$ | Clr Bar & Hi $O_2$ | Clr Bar & 10 $CO_2$/ 40 $O_2$ | Clr Bar & 50 $CO_2$/20 $O_2$ | Clr Bar & 40 $CO_2$/10 $O_2$ |
|---|---|---|---|---|---|---|---|---|---|
| Delta X-Bar | −11 | 10 | 16 | 25 | 28 | 27 | 19 | 6 | 14 |
| Range | 28 | 27 | 26 | 21 | 22 | 23 | 20 | 17 | 18 |
| 3 Sigma | 17 | 15 | 16 | 11 | 12 | 12 | 11 | 10 | 10 |
| Delta Y-Bar | −10 | 13 | 12 | 28 | 33 | 29 | 22 | 10 | 16 |
| Range | 21 | 23 | 21 | 15 | 17 | 21 | 20 | 16 | 17 |
| 3 Sigma | 13 | 13 | 14 | 8 | 9 | 10 | 9 | 8 | 8 |

The Delta X-bar and Y-bar is referred to as Mean-to-Target (MTT) in x-direction/y-direction or sometimes called CD (Critical Dimension) bias. It is a measurement to find out how far off the actual measurement is from the target. Hence, the smaller the CD bias or MTT, the closer the actual measurements are to the target. In the plot of CD Data in X or Y directions, the best process is the process with the lowest number in (i) 3-sigma (uniformity), (ii) in range (highest measurement-lowest measurement), and in (iii) MTT or Delta X-bar/Y-bar. As seen from the figures and Table 2, the best process would be the use of a clear bar with etch conditions of 10 SCCM $O_2$/40 SCCM $CO_2$. In one implementation, the etch conditions include between about 40 SCCM $O_2$ and 10 SCCM for $CO_2$ and 10 SCCM $O_2$ and 40 SCCM $CO_2$ for providing CD uniformity in 3-sigma of less than 10 nm and in range of about 20 nm or less.

As discussed above, in embodiments, when the selectivity is about or lower than 1:1, improvements in mask CD uniformity are still obtained with the invention. By way of example, and referring to Table 2, above, when using a ratio of gas mixture of 40 for $CO_2$ and 40 for $O_2$, there is a selectivity of about 0.9:1, which is lower than a 1:1 ratio; however, in this example, there is a 3-sigma of 12 and an in range of 22 in the X axis. This shows better results than that of the POR, which is a conventional process. In another example, when using a ratio of gas mixture of 50 SCCM for $CO_2$ and 20 SCCM for $O_2$, there is a selectivity of about 1:1; however, in this example, there is a 3-sigma of 10 and an in range of 17 in the X axis. This, again, shows better results than that of the POR.

Figure 7A:
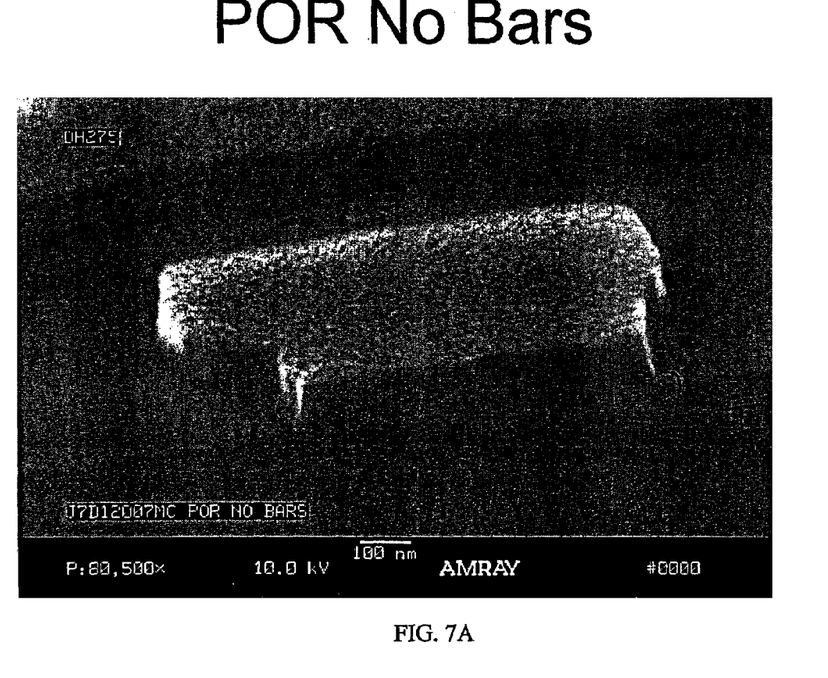
FIGS. 7A though 7D show several examples of cross sections of a photomask, using different build processes.
Figure 7B:
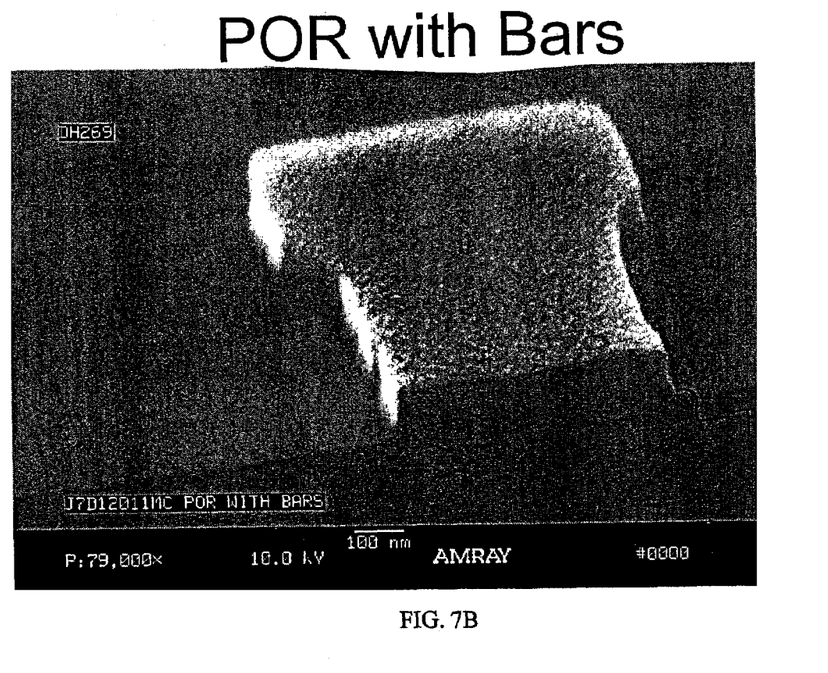
Figure 7C:
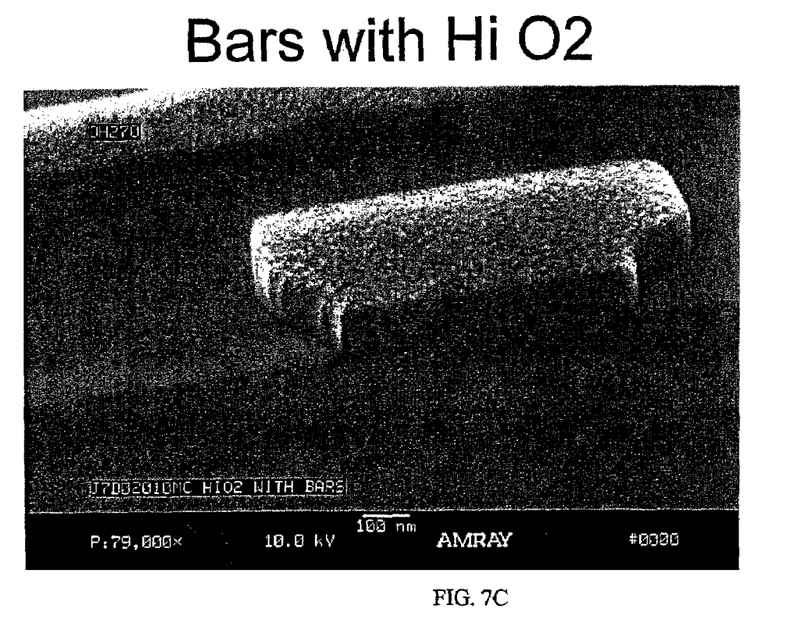
Figure 7D:
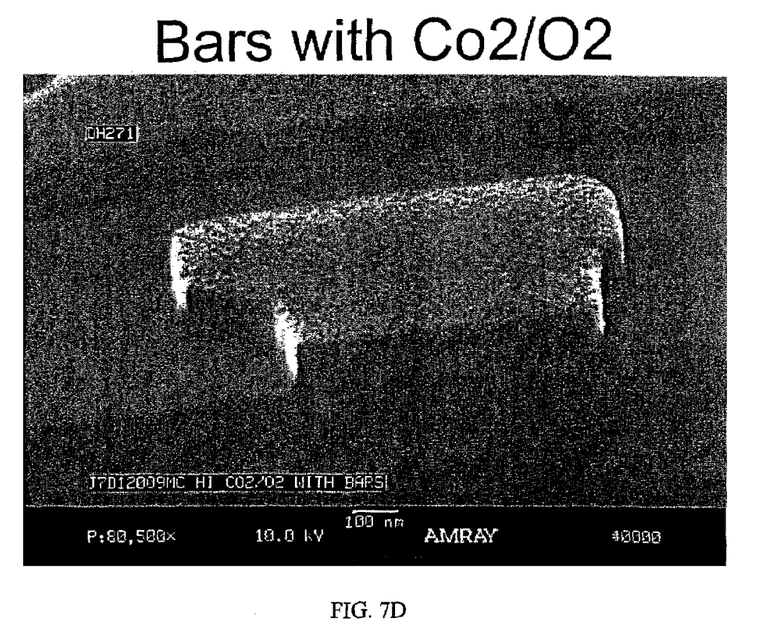

FIGS. 7A though 7D show several examples of cross sections of the mask, using different build processes. The structure shown in FIGS. 7A–7D is used to fabricate a polysilicon gate. As shown in FIGS. 7A and 7B, using conventional build processes, the mask or etched chrome sidewall has a tail "T" or foot at an edge. This tail may sometimes result in a bridge between adjacent gates thus shorting the device (PC to PC short). This tail may also result in a printed gate which is too large thus slowing speed down in the microprocessor. The structure shown in FIG. 7C does not result in the tail. This structure was formed with a high $O_2$ mixture with clear bar. The structure shown in FIG. 7D, using the processes of the invention with a $CO_2$ and $O_2$ concentration, also does not result in the tail. This process, as discussed above, has a higher selectivity to the Cr layer than that with the high $O_2$ concentration, alone.

While the invention has been described in terms of an embodiment, those skilled in the art will recognize that the invention can be practiced with modification within the spirit and scope of the appended claims.

The invention claimed is:

1. A method for manufacturing a photomask, comprising steps of:
    forming an opaque layer; and
    etching the opaque layer by using a gas mixture having a selectivity of about 1.2:1 between the opaque layer and the resist layer.

2. The method of claim 1, wherein the gas mixture comprises $Cl_2$, He, $O_2$ and $CO_2$.

3. The method of claim 2, wherein a ratio of gas mixture among $Cl_2$, He, $O_2$ and $CO_2$ is 4:1:1:2.5.

4. The method of claim 3, wherein the gas mixture ratio in volume is about 60% for $Cl_2$, 9% for He, 6% for $O_2$ and 25% for $CO_2$.

5. The method of claim 1, wherein the opaque layer is Cr, a Cr compound, a Mo alloy or W.

6. The method of claim 1, wherein the CD (critical dimension) uniformity, 3-sigma, for manufacturing a photomask is 10 nm or less.

7. The method of claim 1, wherein the resist layer is a CAR (chemically amplified resist) or e-beam resist or laser (optical) type resist.

8. The method of claim 1, wherein the etch conditions include between about a ratio of 40 for $O_2$ and 10 for $CO_2$ and 10 for $O_2$ and 40 for $CO_2$.

9. The method of claim 8, wherein the etch conditions are in a ratio of about 50 for $CO_2$ and 20 for $O_2$.

10. The method of claim 1, wherein the etch conditions include between about a ratio of 40 for $O_2$ and 10 for $CO_2$ and 10 for $O_2$ and 40 $CO_2$ for a providing CD uniformity in 3-sigma of less than 10 nm and in range of about 20 nm or less.

11. The method of claim 1, wherein the etch conditions include a ratio of about 40 for $O_2$ and 10 for $CO_2$ for a providing CD uniformity in 3-sigma of less than 10 nm.

12. The method of claim 1, wherein the gas mixture comprises $Cl_2$, He, $O_2$ and $CO_2$ with a gas mixture ratio in volume of about 60% for $Cl_2$, 9% for He, 6% for $O_2$ and 25% for $CO_2$.

13. The method of claim 1, wherein the etch conditions include a ratio of about 10 for $0_2$ and 40 for $CO_2$ for a selectivity Cr:Resist of 1.2:1.

14. The method of claim 1, wherein the opaque layer is Cr, and a Cr rate is about 4.47 Å/sec. and the resist rate is about 3.71 Å/sec.

15. A method for manufacturing a photomask, comprising etching an opaque layer by using a gas mixture of $Cl_2$, He, $O_2$ and $CO_2$ with etch conditions between about a ratio of 40 for $O_2$ and 10 for $CO_2$ and 10 for $O_2$ and 40 for $CO_2$, wherein the etch conditions provide a zero iteration mask fabrication.

16. The method of claim 15, wherein the etch conditions provide a selectivity of Cr:Resist of about or less than 1:1.

17. The method of claim 15, wherein the etch conditions provide CD uniformity in 3-sigma of less than 10 nm and in range of about 20 nm or less.

18. The method of claim 15, wherein the etch conditions include a ratio of about 40 for $O_2$ and 10 for $CO_2$ for a providing CD uniformity in 3-sigma of less than 10 nm.

19. The method of claim 15, wherein the gas mixture comprises $Cl_2$, He, $O_2$ and $CO_2$ with a gas mixture ratio in volume of about 60% for $Cl_2$, 9% for He, 6% for $O_2$ and 25% for $CO_2$.

20. The method of claim 15, wherein a gas ratio of $Cl_2$, He, $O_2$ and $CO_2$ is 4:1:1:2.5, wherein the opaque layer is Cr, a Cr compound, a Mo alloy or W.

21. A photomask comprising a substrate and an opaque layer selectively formed on the substrate, the mask manufactured by steps comprising etching the opaque layer with either a chlorine or fluorine containing species and a gas mixture of $O_2$ and $CO_2$ having a selectivity lower than 1:1 between the opaque layer and the resist layer.

22. The photomask of claim 21, wherein the gas mixture is $Cl_2$, He, $O_2$ and $CO_2$.

23. The photomask of claim 21, wherein a ratio of gas mixture among $Cl_2$, He, $O_2$ and $CO_2$ is 4:1:1:2.5 and the gas mixture ratio in volume is 60% for $Cl_2$, 8.7% for He, 6.2% for $O_2$ and 25% for $CO_2$.

24. The photomask of claim 21, wherein the opaque layer is Cr, a Cr compound, a Mo alloy or W.

25. The photomask of claim 21, wherein the CD (critical dimension) uniformity, three sigma, for manufacturing the photomask is less than 10 nm.

26. The photomask of claim 21, wherein the resist layer is a CAR (chemically amplified resist) or e-beam resist or laser (optical) type resist.

27. The photomask of claim 21, further comprising a reflection prevention layer formed on the opaque layer, wherein
the substrate is a transparent material and the reflection prevention layer is an oxide of the opaque layer.

* * * * *